United States Patent [19]
Divljakovic et al.

[11] Patent Number: 6,051,980
[45] Date of Patent: *Apr. 18, 2000

[54] PULSE WIDTH MODULATION SIMULATOR FOR TESTING INSULATING MATERIALS

[75] Inventors: Vojislav V. Divljakovic; Joseph A. Kline, both of St. Charles, Mo.

[73] Assignee: Emerson Electric Co., St. Louis, Mo.

[*] Notice: This patent issued on a continued prosecution application filed under 37 CFR 1.53(d), and is subject to the twenty year patent term provisions of 35 U.S.C. 154(a)(2).

[21] Appl. No.: 08/814,431

[22] Filed: Mar. 10, 1997

Related U.S. Application Data

[62] Division of application No. 08/526,264, Sep. 12, 1995, Pat. No. 5,648,725.

[51] Int. Cl.[7] .................................................. G01R 31/08
[52] U.S. Cl. .......................... 324/544; 324/551; 324/703
[58] Field of Search ................................. 324/551, 520, 324/533, 529, 772, 541, 544, 532, 703; 174/113 C

[56] References Cited

U.S. PATENT DOCUMENTS

| | | | |
|---|---|---|---|
| 2,452,624 | 11/1948 | Zimmerman | 324/544 |
| 3,742,755 | 7/1973 | Smith | 374/22 |
| 4,208,542 | 6/1980 | Endo | 174/113 C |
| 4,658,213 | 4/1987 | Finley | 324/772 |
| 4,791,811 | 12/1988 | Barbee . | |
| 4,866,392 | 9/1989 | Lefeldt | 324/541 |
| 4,887,041 | 12/1989 | Mashikian | 324/533 |
| 4,929,903 | 5/1990 | Saigo et al. . | |
| 5,150,059 | 9/1992 | Bognàr et al. . | |
| 5,155,441 | 10/1992 | Zelm . | |
| 5,276,401 | 1/1994 | Soma et al. . | |
| 5,448,176 | 9/1995 | Mashikian | 324/544 |
| 5,469,066 | 11/1995 | Ito et al. . | |
| 5,530,364 | 6/1996 | Mashikian | 324/529 |
| 5,648,725 | 7/1997 | Divljakovic | 324/551 |

OTHER PUBLICATIONS

Divljakovic, V. and J. Kline, Aging of Magnetic Wire in the Presence of Variable Frequency, High Rise Time and High Voltage Pulses, Conference on Electrical Insulation and Dielectric Phenomena (CEIDP) 1995 Annual Report, pp. 391–399.

Rehder, R.H., and M.E. Stutt, Developments to Reduce Deterioration Caused by Corona in Large Electrical Machines Insulation, IEEE publication, Paper No. PCIC–93–08, 1993, pp. 75–79.

Johnson, D.R. and J.T. LaForte, Corona Resistant Turn Insulation in AC Rotation Machines, Electrical/Electronics Insulation Conference, IEEE publication CH2133–Jul. 1985/0000–0308, Jun. 1985, pp. 308–310.

Bonnett, Austin H., Analysis of the Impact of Pulse Width Modulated Inverter Voltage Waveforms on A.C. Induction Motors, Conference Record of 1994 Annual IEEE Pulp and Paper Industry Technical Conference, pp. 68–75.

Rieuz, N., V. Pouilles, and T. Lebey, Dielectric Spectroscopy of Epoxy Based Insulation Systems Aged Under Functional Electrical and Thermal Conditions, Conference on Electrical Insulation and Dielectric Phenomena (CEIDP), 1994, pp. 361–366.

Yin, W., K. Bultemeier, D. Barta and D. Floyan, Dielectric Integrity of Magnet Wire Insulations under Multi–Stresses, Proceedings from Electrical/Electronics Insulation Conference and Electrical Manufacturing and Coil Winding (EEIC/EMCW), 1995, pp. 257–261.

*Primary Examiner*—Josie Ballato
*Assistant Examiner*—Jose M. Solis
*Attorney, Agent, or Firm*—Howell & Haferkamp, L.C.

[57] ABSTRACT

A test instrument for testing magnet wire which is provided which tests, collects and permits analyzing the effect of temperature, frequency, voltage and rise time associated with magnet wire use, and more particularly, the effects of those variables on the insulation of the wire, so as to evaluate the magnet wire performance and inverter controlled dynamoelectric machine applications.

30 Claims, 2 Drawing Sheets

PULSE WIDTH MODULATION SIMULATOR FOR TESTING INSULATING MATERIALS

This is a divisional of application Ser. No. 08/526,264 filed on Sep. 12, 1995 now U.S. Pat. No. 5,648,725.

BACKGROUND OF THE INVENTION

This invention relates to test instruments for testing life expectancy of magnet wire used in dynamoelectric machines. While the invention is described with particular reference to the test instrument's ability to test magnet wire intended for use in dynamoelectric machines associated with inverter controls, those skilled in the art will recognize the wider applicability of the inventive principles disclosed hereinafter.

It is well known that degradation of wire insulation can be caused by thermal, electrical, mechanical, or environmental stress, alone or in combination with one another. Thermal stress is introduced by aging, overloading and cycling. Electrical stress is related to dielectric, cracking, corona and transient spikes. Mechanical stress results from impact, stretching, and coil movement during coil winding, assembly, and machine operation. Environmental stress is introduced by moisture, chemical and foreign objects in the environmental area of the dynamoelectric machine. All of these stresses can be, and often are, present at the same time in applicational use. Motor manufacturers have long recognized the effects these factors have on magnet wire.

With the increased use of pulse width modulated (pwm) type of adjustable speed drives in the motor industry, the incidents of premature failure in wire insulation has increased. Dynamoelectric machines being controlled with pulse width modulated variable speed drives no longer experience the traditional sine wave voltage, which is a steady state condition with a maximum and a rms value. Rather, the machines experience a pulse width modulated voltage with significance harmonics and transients. We have found that motor failures in inverter applications result in premature failure of the wire insulation. To understand the failure mechanism of magnet wire insulation under such condition, we have devised a test instrument which simulates inverter output in order to evaluate wire performance in that environment.

The basis of the thermal aging model is a well known Arrhenius chemical reaction rate model: Life=$A \times e^{-(B/T)}$, where A and B are the constants determined by the activation energy in the reaction rate of the particular degradation reaction, and T is the absolute temperature. This model neglects threshold effects (aging starts only if a certain temperature is reached), and the model assumes that only one chemical reaction is occurring. Nevertheless, this model presently is an accepted standard in industry.

Voltage aging models also have been developed. The voltage aging models conventionally are divided into two groups, the inverse power model and the exponential model. The inverse power model of electrical aging is expressed as: Life=$K \times E^{-n}$, where K is a constant and a characteristic of the material system, n is an experimentally obtained constant depending on operating conditions, and E is the applied voltage.

An alternative, exponential life model is given by: Life=$C \times e^{-DE}$, where C and D are constants, and E is the value of the applied voltage.

The basic models, given by the above equations, have been changed in order to allow for the description of threshold degradation, or combined in order to provide a model for multi-factor aging.

We were aware of the research being conducted in this area. Motivated by the number of early failures occurring in industrial applications of power inverter drives, we have designed a testing system that allows for the varying of the parameters that are characteristic of power inverters, i.e., voltage, frequency, duty cycle, and rise time in combination with the conventional thermal aging problem inherent in insulation dialectics applied to magnet wire, or other portions of the insulative system applied to a dynamoelectric machine.

One of the objects of this invention is to provide a test instrument which permits improved testing of magnet wire intended for use in dynamoelectric machines.

Another object of this invention is to provide a test instrument which tests wire which is intended for use in applications having pulse width modulated drive systems.

Another object of this invention is to provide a test instrument which permits variations of pulse width, voltage, rise time and temperature applied to the test sample.

Another object of this invention is to provide a test instrument which permits testing of both voltage and/or current variation and a test sample.

Another object of this invention is to provide a test instrument which permits easy modification of the testing procedure for implementing additional factors which may affect insulation life.

Another object of this invention is to provide a test instrument which is relatively easy to operate.

Other objects of this invention will be apparent to those skilled in the art in light of the following description and accompanying drawings.

SUMMARY OF THE INVENTION

In accordance with this invention, generally stated, a test instrument is provided for duplicating inverter drive stress on magnet wire by permitting variations of temperature of the wire, and peak voltage, frequency and rise time of the electrical characteristic applied to the wire. A method of testing wire for use in dynamoelectric machines also is disclosed.

DESCRIPTION OF THE PREFERRED EMBODIMENT

Figure 1:
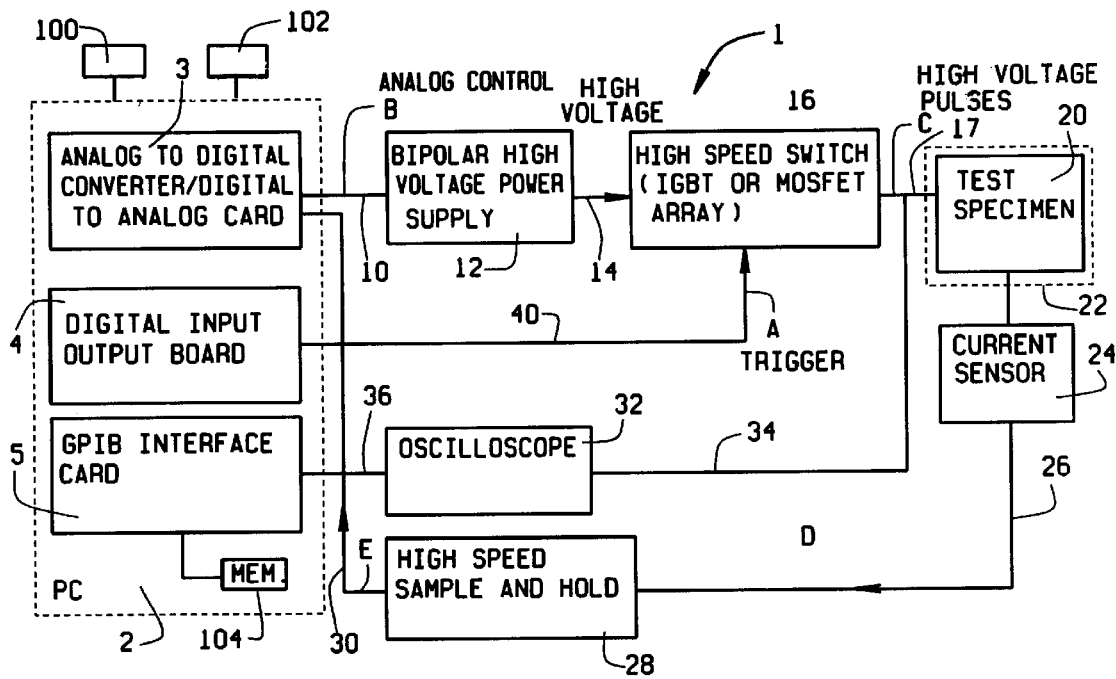
FIG. 1 is a block diagrammatic view of one preferred embodiment of the test instrument in the present invention.

Referring now to FIG. 1, referenced numeral 1 indicates one illustrative embodiment of test instrument of the present invention. The test instrument 1 includes a computer 2 adapted to include an analog to digital and digital to analog converter card 3, a digital input/output board 4, and a general purpose interface bus (gpib) 5. The computer 2 may comprise any of a variety of commercially available devices (PC's) modified as described above. Such devices commonly include a monitor 100, a keyboard 102, and a suitable memory 104 operatively arranged in the manner shown in FIG. 1 and described below. The memory 104 stores a program for controlling the operating characteristics of the test instrument 1.

The computer 2 has an output 10 from the analog to digital converter card 3 to high voltage power supply 12. An output 14 of the power supply 12 is operatively connected to a high speed switch array 16. The high speed switch array 16 may be constructed from integrated gate bipolar transistors (igbts) or metal oxide semiconductor field effect transistors (mosfets), depending upon the intended applicational use of the motor employing the magnet wire in the test. Other switch arrays are compatible with the broader aspects of this invention.

The switch array 16 has an output side 17 electrically connected to a test specimen 20, which may be environmentally segregated with respect to temperature in a heat chamber or oven 22. Also electrically connected to the specimen 20 is a current sensor 24. The current sensor 24 has an output side 26 electrically connected to a sample and hold device 28. An output side 30 of the sample and hold circuit 28 is electrically connected to the analog to digital and digital to analog converter card 3 of the computer 2. The digital board 4 has an output 40 operatively connected to the array 16.

An oscilloscope 32 is connected to the output side 17 of the high speed switch array 16 along a conductor 34. An output 36 of the oscilloscope 32 is connected to the interface card 5.

Figure 2:
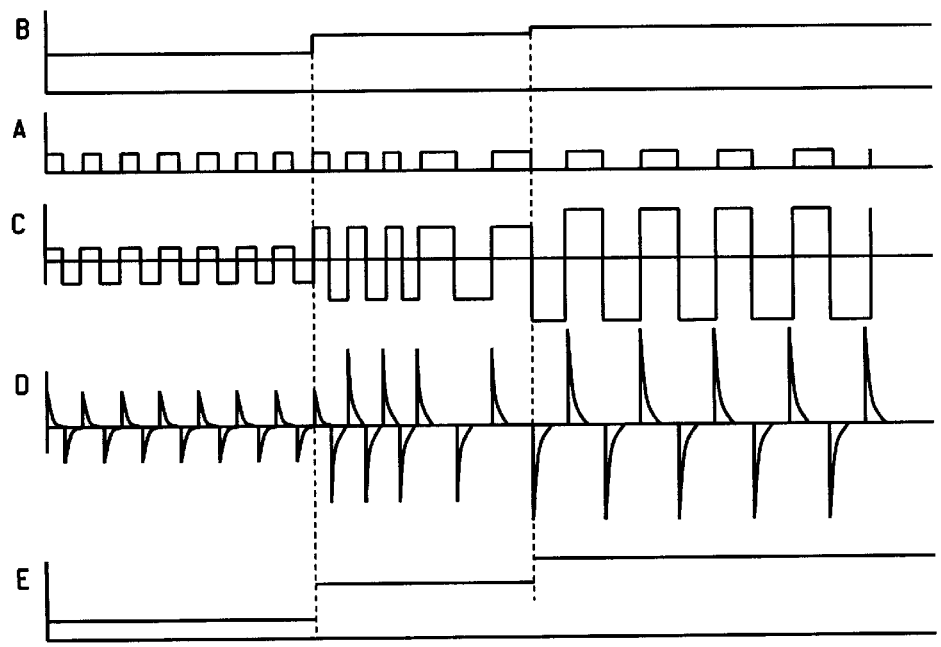
FIG. 2 is a diagrammatic view of the wave form characteristic for the instrument shown in FIG. 1.

The operation of the instrument 1 is under control of the computer 2. A user can set up the parameters of the test wave form, such as peak voltage, frequency, duty cycle and rise time. Two control voltages are generated as a consequence of these settings. The DC voltage at the output 10, generated by means of the analog card 3, corresponds to waveform B in FIG. 2. The voltage of waveform B controls the output level of the bipolar high voltage power supply 12. Data also is entered at the computer 2 for controlling the duty factor and the frequency of pulses to be applied to the test specimen 20. This information is converted into the trigger pulse train, which is generated by means of the digital input/output card 4, and corresponds to the waveform A shown in FIG. 2. The high voltage from the power supply 12 is fed to the switching devices of the high speed switch array 16. The array 16 is controlled by the trigger pulses on the line 40. The array 16 generates the bipolar pulse train, waveform C in FIG. 2 at its output 17. Waveform C of FIG. 2 represents the output pulse train that is applied to the test specimen 20. The test specimen, which may be a twisted pair of wires, or a motorette in situations where insulated material used for phase to phase or phase to ground insulation also is being tested, is located within the heat chamber 22. The instrument 1 generates the output pulse train C that is fed to the test specimen 20 as long as the integrity of the insulation under test is preserved.

Breakdown of the insulation may be detected by a number of ways, two of which are preferred. The first method is based on voltage failure detection. The second method is based on current detection.

In the first method, voltage pulses are monitored using digital acquisition of the output pulses C at the output 17 of the array 16 by means of the oscilloscope 32. Once the output pulse is captured, it is transferred to the memory of the computer in digital form, using the general purpose interface bus or other appropriate parallel or serial links. The voltage wave form also can be digitized using fast analog to digital converters. The control program in the memory of the computer 2 compares the voltage waveform with a template generated at the beginning of the test for the sample under test. If the voltage deviates in amplitude by more than 20%, the program recognizes a failure of insulation. The percent setting for recognizing the failure of insulation is adjustable, and may be varied depending upon use of the magnet wire under test.

Figure 3:
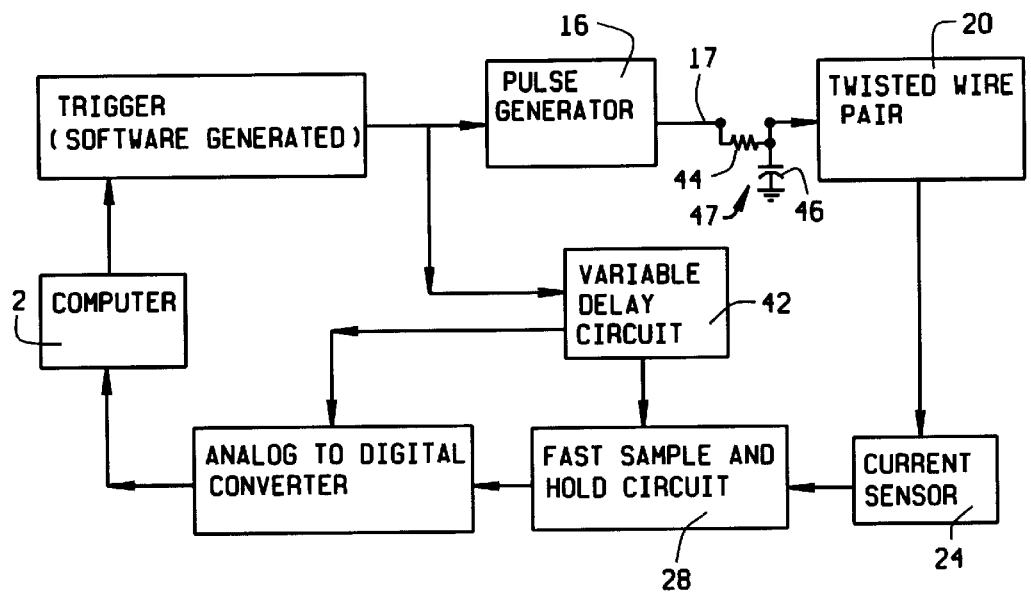
FIG. 3 is a block diagrammatic view for the current sensing circuitry portion the instrument shown in FIG. 1.

Referring now to FIG. 3, a block diagram for detecting insulation failure based on current sensing scheme is shown. Like numerals are used to describe like parts, where appropriate. The computer 2 is designed to trigger pulses which initiates the opening of suitable switches in the high speed switch or pulse generator 16. The charging current from the pulse generator charges a wire capacitor in the form of a twist pair wire specimen 20. The charging current of the wire capacitor, shown in FIG. 2 waveform as D, is transformed into a voltage signal by means of the current sensor 24. The voltage from the current sensor 24 is fed to the input side of the sample and hold circuit 28. A hold pulse for the sample and hold circuit 28 is generated by a variable delay circuit 42, which is controlled by the same pulse that was used for triggering the pulse generator 16. The delay between the rise (or falling edge) of the trigger pulse and the rise (or falling edge) of the hold pulse is controlled by means of the variable delay circuit 42, shown in FIG. 3. A network 47 is inserted on the output side 17 of the generator 16. In this manner, the current is always sensed at the same instant with respect to the rising edge of the trigger pulse. The sample and hold circuit 28 transforms the narrow current charging pulse into a direct current voltage level, FIG. 2 waveform E, that is converted into digital data using standard analog to digital converter 3. The time for the conversion is limited by the frequency of the pulses, and not by the fast rise time of the pulse. The digital data from the analog to digital converter 3 is fed to the computer 2. The computer monitors the change of amplitude of the current, and provides an indication of insulation failure if a certain predetermined value of the current is reached. The predetermined value of current is adjustable under program control at the computer 2.

As indicated above, change in the rise time is achieved by adding the RC network 47 to the output side 17 of the pulse generator 16. As will be appreciated by those skilled in the art, the circuit is a simple integrator, made up of a resistor 44 and a capacitor 46. (Capacitor 46 is to be distinguished from the wire capacitor formed by the twist pair wire specimen 20 referred to above.) The time constant of the circuit is determined by the product of the resistance of resistor 44 and the capacitor 46 values. The higher the time constant of the circuit, the longer is the rise time of the pulses used in the test.

Regardless of the method used to monitor failure in insulation, computer 2 tracks the time to failure. Once the failure is registered, analysis of data stored in the computer is accomplished.

Our experience has shown that there is a strong correlation between the life of magnet wire insulation, and other insulation employed in dynamoelectric machines being operated by inverters and the exponential model described here and utilizing voltage, temperature, and frequency of the pulses as variables. We also have observed that decreasing the voltage for the frequency under certain threshold values has positive effects on the life of the insulation. As indicated, we have found that voltage, temperature, and frequency, in that order, are the most important factors influencing insulation life.

Figure 4:
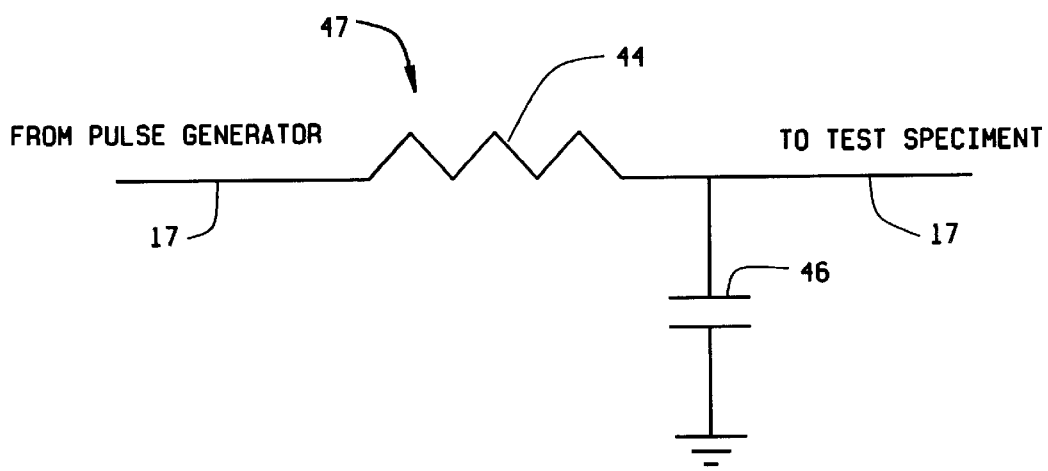
FIG. 4 is a diagram of an integrator circuit for varying the rise time of the voltage applied to the test specimen and the device shown in FIG. 3.

Numerous variations, within the scope of the appended claims, will be apparent to those skilled in the art in view of the foregoing description and accompanying drawings. Thus, other types of pulse generators or switching devices may be employed in various embodiments of this invention, in addition to or in place of mosfet or igbt devices described. Likewise, while a range between 60 and 20,000 Hz has been described as the operational range of the switching array, other pulse width modulation designs may be employed, if desired. Other electrical devices are available for capturing data of the test specimen. The oscilloscope and current sensor is described in conjunction with FIGS. 1 and 4 may be replaced by other devices, if desired. While single line representations are employed to interconnect various component parts of our invention for the sake of simplicity, those skilled in the art recognize that the single line representations may be multiple electrical connections in actual embodiments of the invention.

These variations are merely illustrative.

Having thus described the invention, what is claimed and desire to be secured by Letters Patent is:

1. A method of testing an insulated wire comprising the steps of:
   applying an electrical pulse train to a test specimen of the insulated wire as long as the integrity of the insulation under test is preserved;
   thermally heating the test specimen of insulated wire;
   determining a change in amplitude of a voltage waveform generated across the test specimen by the electrical pulse train;
   providing an indication of a failure when the change in amplitude is equal to a selected amount; and
   tracking a time to failure.

2. The method of claim 1 and further comprising the step of adjusting at least one parameter of the electrical pulse train.

3. The method of claim 2, wherein the step of adjusting parameters of the electrical pulse train comprises the steps of:
   adjusting a peak voltage of the electrical pulse train; and
   adjusting a frequency and duty cycle of the electrical pulse train.

4. The method of claim 3, wherein the step of adjusting a peak voltage of the electrical pulse train comprises the step of controlling an output voltage produced by a power supply, and the step of adjusting a frequency and duty cycle of the electrical pulse train comprises the steps of applying the output voltage produced by the power supply to a switch array and applying trigger pulses to the switch array to generate the electrical pulse train with the adjusted peak voltage, frequency and duty cycle.

5. The method of claim 3 and further comprising the step of adjusting the rise time of pulses in the electrical pulse train.

6. The method of claim 1 and further comprising the step of adjusting at least one parameter of the electrical pulse train to thereby increase the applied stress to the test specimen.

7. The method of claim 1 wherein the selected amount is 20%.

8. A method of testing insulated wire comprising the steps of:
   applying an electrical pulse train to a wire capacitor comprising a specimen of the insulated wire to thereby generate a charging current waveform as long as the integrity of the insulation under test is preserved;
   thermally heating the specimen of the insulated wire;
   determining a change in amplitude of the charging current waveform of the wire capacitor;
   providing an indication of insulation failure when a predetermined value of charging current is reached; and
   tracking a time to failure.

9. The method of claim 8 wherein the applying step comprises applying an electrical pulse train to a capacitor formed by a twisted pair specimen of the insulated wire.

10. The method of claim 8 wherein the measuring step comprises the steps of:
    triggering the pulse train with a trigger pulse having rising edges; and
    sensing the charging current waveform at a fixed interval with respect to the rising edges of the trigger pulse.

11. The method of claim 8 wherein the measuring step further comprises:
    transforming the sensed waveform into a direct current voltage level.

12. The method of claim 8 wherein the sensing step further comprises the step of converting an analog signal to a digital representation of a current value of the charging current waveform, and the storing step further comprises storing the digital representation in a memory.

13. The method of claim 12 and further comprising the step of adjusting parameters of the electrical pulse train.

14. The method of claim 13 wherein the step of adjusting parameters of the electrical pulse train comprises the steps of:
    adjusting a peak voltage of the electrical pulse train; and
    adjusting a frequency and duty cycle of the electrical pulse train.

15. The method of claim 14, wherein the step of adjusting a peak voltage of the electrical pulse train comprises the step of controlling an output voltage produced by a power supply, and the step of adjusting a frequency and duty cycle of the electrical pulse train comprises the steps of applying the output voltage produced by the power supply to a switch array and applying trigger pulses to the switch array to generate the electrical pulse train with the adjusted peak voltage, frequency and duty cycle.

16. The method of claim 14 and further comprising the step of adjusting the rise time of pulses in the electrical pulse train.

17. A method of testing insulated wire comprising the steps of:
    triggering a pulse generator with a trigger pulse to generate an electrical pulse train;
    applying the electrical pulse train to a wire capacitor comprising a specimen of the insulated wire to thereby generate a charging current waveform as long as the integrity of the insulation under test is preserved;
    sensing at the same instants with respect to rising or falling edges of the trigger pulse, the charging current of the wire capacitor;
    providing an indication of insulation failure when a predetermined value of charging current is reached; and
    tracking a time to failure of the insulation.

18. The method of claim 17 wherein the step of applying the electrical pulse train comprises applying an electrical pulse train to a wire capacitor formed by a twisted pair specimen of the insulated wire.

19. The method of claim 17 wherein the sensing step comprises transforming the sensed waveform into a direct current voltage level.

20. The method of claim 17 and further comprising the step of thermally heating the test specimen.

21. The method of claim 20 and further comprising the step of adjusting parameters of the electrical pulse train.

22. The method of claim 21, wherein the step of adjusting parameters of the electrical pulse train comprises the steps of:
   adjusting a peak voltage of the electrical pulse train; and
   adjusting a frequency and duty cycle of the electrical pulse train.

23. The method of claim 22, wherein the step of adjusting a peak voltage of the electrical pulse train comprises the step of controlling an output voltage produced by a power supply, and the step of adjusting a frequency and duty cycle of the electrical pulse train comprises the steps of applying the output voltage produced by the power supply to a switch array and applying trigger pulses to the switch array to generate the electrical pulse train with the adjusted peak voltage, frequency, and duty cycle.

24. The method of claim 22 and further comprising the step of adjusting the rise time of pulses in the electrical pulse train.

25. A method of testing an insulated wire comprising the steps of:
   applying an electrical pulse train to a test specimen of insulated magnet wire as long as the integrity of the insulation under test is preserved;
   thermally heating the test specimen of insulated magnet wire;
   determining a change in amplitude of a voltage waveform generated across the test specimen by the electrical pulse train;
   providing an indication of a failure when the change in amplitude is equal to a selected amount; and
   tracking a time to failure.

26. The method of claim 25 wherein the applying step comprises applying the electrical pulse train to a wire capacitor comprising a twisted pair specimen of the insulated magnet wire.

27. A method of testing insulated wire comprising the steps of:
   applying an electrical pulse train to a wire capacitor comprising a specimen of insulated magnet wire to thereby generate a charging current waveform as long as the integrity of insulation of the insulated magnet wire under test is preserved;
   thermally heating the specimen of the insulated magnet wire;
   determining a change in amplitude of the charging current waveform of the wire capacitor;
   providing an indication of insulation failure when a predetermined value of charging current is reached; and
   tracking a time to failure.

28. The method of claim 27 wherein the applying step comprises applying the electrical pulse train to a wire capacitor comprising a twisted pair specimen of the insulated magnet wire.

29. A method of testing insulated wire comprising the steps of:
   triggering a pulse generator with a trigger pulse to generate an electrical pulse train;
   applying the electrical pulse train to a wire capacitor comprising a specimen of insulated magnet wire to thereby generate a charging current waveform as long as the integrity of the insulation of the magnet wire under test is preserved;
   sensing at the same instants with respect to rising or falling edges of the trigger pulse, the charging current of the wire capacitor;
   providing an indication of insulation failure when a predetermined value of charging current is reached; and
   tracking a time to failure of the insulation of the magnet wire under test.

30. The method of claim 29 wherein the applying step comprises applying the electrical pulse train to a wire capacitor comprising a twisted pair specimen of the insulated magnet wire.

* * * * *